United States Patent
Newman et al.

(10) Patent No.: US 6,661,102 B1
(45) Date of Patent: Dec. 9, 2003

(54) SEMICONDUCTOR PACKAGING APPARATUS FOR CONTROLLING DIE ATTACH FILLET HEIGHT TO REDUCE DIE SHEAR STRESS

(75) Inventors: Robert A. Newman, Santa Clara, CA (US); Jaime D. Weidler, Sunnyvale, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/053,994

(22) Filed: Jan. 18, 2002

(51) Int. Cl.[7] .................... H01L 23/495; C03C 3/12
(52) U.S. Cl. ................ 257/787; 257/783; 257/793; 257/674; 257/676; 257/795; 257/790
(58) Field of Search ................ 257/734, 676, 257/737, 674, 738, 728, 787–793, 795, 782, 783

(56) References Cited

U.S. PATENT DOCUMENTS

| | | | | |
|---|---|---|---|---|
| 4,908,086 A | * | 3/1990 | Goodrich et al. | 156/181 |
| 5,076,876 A | * | 12/1991 | Dietz | 156/325 |
| 5,278,446 A | * | 1/1994 | Nagaraji et al. | 257/707 |
| 5,449,951 A | * | 9/1995 | Parthasarathi et al. | 257/677 |
| 5,543,366 A | * | 8/1996 | Dietz et al. | 501/41 |
| 5,756,380 A | * | 5/1998 | Berg et al. | 438/126 |
| 5,773,878 A | * | 6/1998 | Lim et al. | 257/676 |
| 5,936,304 A | * | 8/1999 | Lii et al. | 257/701 |
| 6,023,666 A | * | 2/2000 | Jiang et al. | 702/173 |
| 6,046,076 A | * | 4/2000 | Mitchell et al. | 438/127 |
| 6,069,023 A | * | 5/2000 | Bernier et al. | 438/107 |
| 6,134,776 A | * | 10/2000 | Hoffmeyer | 257/706 |
| 6,184,064 B1 | * | 2/2001 | Jiang et al. | 257/739 |
| 6,201,301 B1 | * | 3/2001 | Hoang | 257/712 |
| 6,225,206 B1 | * | 5/2001 | Jimarez et al. | 438/616 |
| 6,309,908 B1 | * | 10/2001 | Sariham et al. | 438/106 |
| 6,353,182 B1 | * | 3/2002 | Chang et al. | 257/737 |
| 6,400,004 B1 | * | 6/2002 | Fan et al. | 257/666 |
| 2002/0137253 A1 | * | 9/2002 | Guida | 438/106 |
| 2002/0179689 A1 | * | 12/2002 | Tung | 228/197 |
| 2003/0034569 A1 | * | 2/2003 | Caletka et al. | 257/796 |

OTHER PUBLICATIONS

Weidler, J. et. al., A Method to Reduce Die Cracking in a PBGA Package.
Natarajan, B. et. al., Die Surface Stresses in a Molded Plastic Package, 544–551, 1986.
Thomas, R.E., Stress–Induced Deformation of Aluminum Metallization in Plastic Molded Semiconductor Devices, 37–45, 1985.
Lesk, I.A. et. al., Progression of Damage Caused by Temperature Cycling on a Large Die in a Molded Plastic Package, 807–812.
Edwards, Darvin R. et. al., Shear Stress Evaluation of Plastic Packages, 84–95.
Kessel, C.G.M. et. al., The Quality of Die–Attachment and its Relationship to Stresses and Vertical Die–Cracking, 237–244, 1983.
Shukla, R.K. et. al., A Critical Review of VLSI Die–Attachment in High Reliability Applications, 67–74, Solid State Technology, Jul. 1985.
Rasiah, Ignatius J., The Influence of Fillet Height of a Low Modulus Die Attach on the Wirebondability of a Plastic Package, 291–295,IEEE/CPMT Rlectronics Packaging Technology Conf. 1998.
Michaelides, Stylianos et. al., Die Cracking and Reliable Die Design for Flip–Chip Assemblies, IEEE Tranactions on Advanced Packaging, vol. 22, No. 4, Nov. 1999.

* cited by examiner

Primary Examiner—Alexander O. Williams
(74) Attorney, Agent, or Firm—LaRiviere Grubman & Payne, LLP

(57) ABSTRACT

A semiconductor packaging apparatus for preventing cracking and delamination in a packaged semiconductor chip by controlling the die attach fillet height. Specifically, the present invention controls the die attach material height, thereby controlling the die attach fillet height, and thereby reducing shear stress in the die itself. Advantages of the present invention include increasing wire-bond reliability and package reliability without the need for requalification of existing products. By using currently qualified molding compounds and die attach epoxies in conjunction with the present technique for controlling the die attach epoxy height in order to control the die attach fillet height, the overall assembly process may be maintained. Thus, neither thermal performance nor electrical performance is compromised.

6 Claims, 7 Drawing Sheets

SEMICONDUCTOR PACKAGING APPARATUS FOR CONTROLLING DIE ATTACH FILLET HEIGHT TO REDUCE DIE SHEAR STRESS

FIELD OF THE INVENTION

The present invention relates to the assembly and packaging of semiconductor chips. More particularly, the present invention relates to assembly and packaging of wire-bonded dies in semiconductor chips. Even more particularly, the present invention relates to reducing shear stress in the dies of semiconductor chips.

BACKGROUND OF THE INVENTION

Currently, the semiconductor industry is demanding better die attach, better packaging, better wire-bonding, and the like, to improve product reliability. Each die is generally attached into a die attach area of a semiconductor package using a eutectic material layer, such as a gold-silicon (Au—Si) eutectic layer and a silver-silicon (Ag—Si), or an organic die attach material, such as an epoxy or a polyimide. Distal ends of a wire are generally respectively bonded to a die and to a lead. A chip is generally secured well into the package; and the die attachment area may provide electric coupling between the chip and the remainder of the lead system. A major requirement for the die attachment area is that it be extremely flat to intimately retain the chip in the package.

With respect to die attachment, the basic objective is to provide the best adhesion between the chip and the package as is possible and to provide the best electrically and/or thermally conducting path or even the best insulating material therebetween, depending on the specific chip application. As such, the die attachment should be strong to prevent delamination during subsequent processing steps or during use. The most widely used die attach materials include gold-filled (Au) and silver-filled (Ag) polyimides and epoxies for electrical and thermal conduction. For insulation purposes, silica-loaded polymers may be used as a die attach material. Unfortunately, both insulator-filled and conductor-filled related art die attach materials tend to delaminate and crack due to their inherent internal stresses after curing. Further, most molding compounds tend to flex around the die during temperature cycling, also inducing cracking or propagating pre-existing cracks.

The related art has attempted to address these issues by providing lower stress molding compounds and lower stress die attach epoxies. However, the use of lower stress molding compounds would require requalification of many existing products. Such product conversions are both difficult and exorbitant. In addition, using a lower stress molding compound requires a decreased loading of silica ($SiO_2$) particles which, then, compromises thermal performance. Similarly, using a lower stress die attach epoxy requires a decreased loading of Au or Ag particles, compromising not only thermal performance but also electrical performance.

Another related art approach has been to use a very low epoxy fillet height in the range of less than 33.33% (i.e., <5 mils fillet height for a 15-mil thick die) for reducing any thermally-induced stress only at the die/encapsulant interface, wherein the encapsulant specifically comprises a glob-top material. Typically, a glob-top encapsulant is known to have inherent weaknesses at the die/glob-top interface, because it is dispensed from a dispenser under ambient conditions over and onto the die's upper surface. As such, the glob-top encapsulant tends to be riddled with voids, compromising adhesion, and therefore, contributing to delamination. However, this related art approach does not address the problem of shear stress in the fillet, in the cracking of a thicker die, nor between the metal circuitry and the bulk silicon on the die. Likewise, these related art techniques do not address problems related to packaging materials other than those associated with the glob-top variety. Therefore, a long-felt need is seen to exist for a method and an apparatus for controlling the die attachment process in order to prevent cracking as well as delamination in a semiconductor chip package under many processing and use conditions.

BRIEF SUMMARY OF THE INVENTION

Accordingly, the present invention provides a method and an apparatus for preventing cracking and delamination in a semiconductor chip package, especially a "plastic" package, such as a plastic quad flat package (PQFP), a thin quad flat package (TQFP), a plastic leadless chip carrier (PLCC) package, a small outline integrated circuit (SOIC) package, although less problematic, some undesirable shear stress may still exist), and any other standard or nonstandard plastic package. Particularly, a ball grid array (BGA) package with an over-molded compound (or "molding compound"), which also experiences cracking and delamination during thermal cycling, thermal shock, or normal operation.

The present invention solves these plastic packaging problems by controlling the die attach fillet height, thereby reducing shear stress in the die itself. The molding compound, such as is used with a BGA, may be applied by dispensing it through gate in a transfer mold (e.g., RTM: resin transfer molding). After filling the mold with the molding compound, heat and pressure may be applied for curing, densifying, and devoiding the molding compound. This technique, when used in the present method for controlling fillet height, results in a non-delaminating semiconductor package, especially for a BGA.

By example only, the present invention empirical data corresponds to various fillet heights that are proportional to various die thicknesses in a range of approximately 4 mils to 30 mils contained in a BGA package under experimental conditions, such as thermal cycling and thermal shock. By using a fillet height in a preferred range of greater than approximately 33% to approximately 75% of the die thickness, the present invention circumvents both (1) the related art problem of coefficient of thermal expansion (CTE) mismatch among the elements within a packaged device, which would otherwise occur in the related art fillet height range of <33% of the die thickness, thereby leading to voids in the die attach material, cracking thereof, and poor thermal conductivity; and (2) the related art problem of high shear stress-induced failures, such as shear stress-induced cracking in the die attach material as well as the die itself, which would otherwise occur in the related art fillet height range of >75% of the die thickness. Surprisingly, the present invention experimental reliability data demonstrates that a nominal fillet height of approximately 50% of the die thickness induces the lowest shear stress in a thicker silicon die (e.g., in a range of approximately 8 mils to approximately 14 mils, preferably in a range of approximately 10 mils to approximately 14 mils). Also surprisingly, a thinner die having a thickness in a range of less than 8 mils, actually imparts adverse results in contravention to the semiconductor packaging industry's belief. A die attach pick-and-place machine, such as an ESEC 2007™, may be used in the present invention. More specifically, the present invention provides a method and an apparatus controlling the die attach epoxy height, thereby controlling the die attach fillet height, and thereby reducing shear stress in the die itself.

Advantages of the present invention include increasing wire-bond reliability and package reliability without the need for requalification of existing products. By using currently qualified molding compounds and die attach epoxies in conjunction with the present technique for controlling the die attach epoxy height in order to control the die attach fillet height, the overall assembly process may be maintained. Thus, the present invention also has the advantage of compromising neither thermal performance nor electrical performance. Also, by controlling the fillet height by regulating the amount of die attach material to be applied, less die attach material is consumed in the packaging process. As such, the present invention method and apparatus prevent cracking and delamination in a semiconductor chip package, especially a ball grid array (BGA) package, during thermal cycling, thermal shock, and normal use, thereby resulting in a more robust package.

BRIEF DESCRIPTION OF THE DRAWING(S)

For a better understanding of the present invention, reference is made to the below-referenced accompanying drawings. Reference numbers refer to the same or equivalent parts of the present invention throughout the several figures of the drawings.

Figure 15:
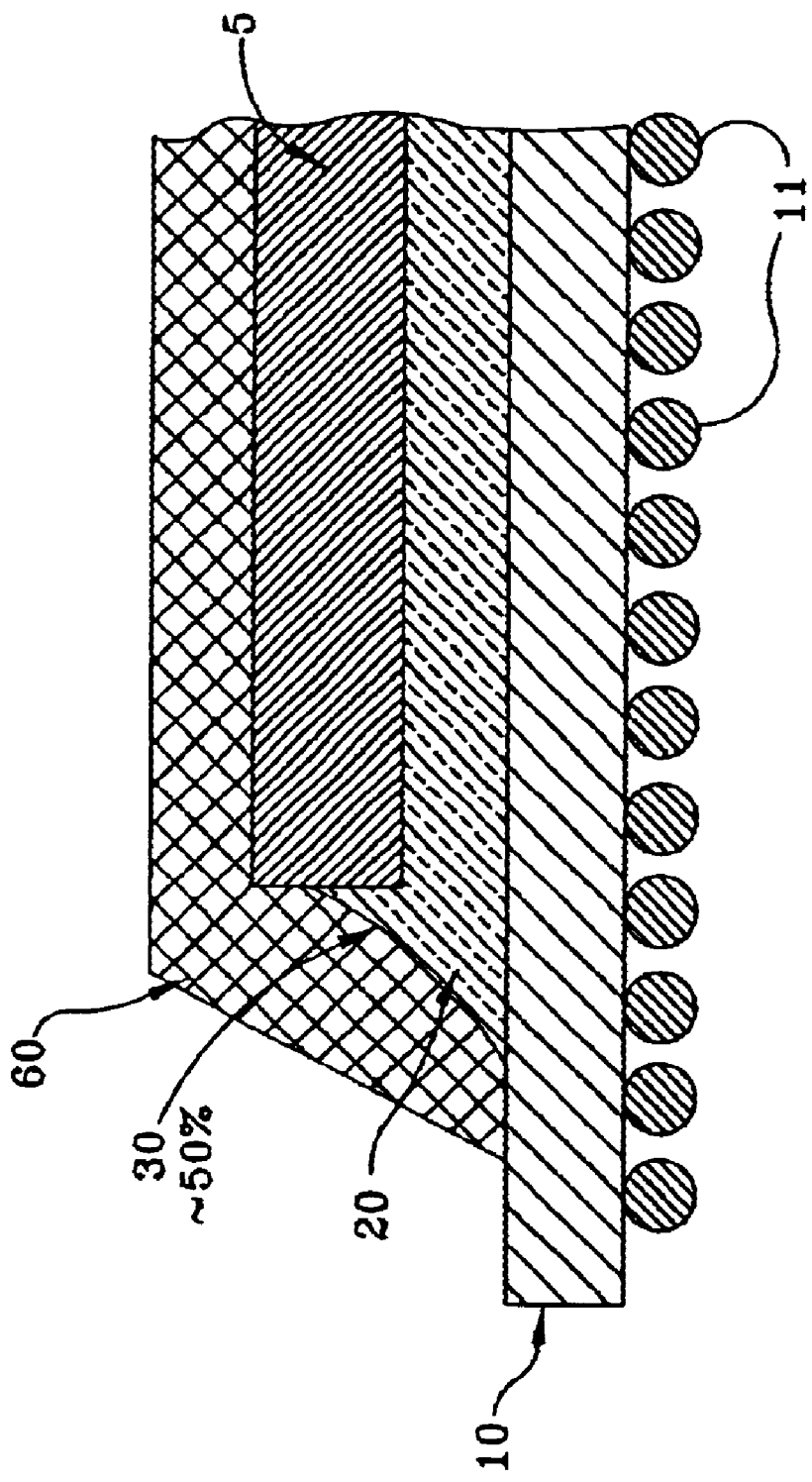

FIG. 15 is a partial cross-sectional view, a die attached to a semiconductor chip package base, such as a BGA package, in a die attachment area with a die attach fillet, showing the critical structural relationship (i.e., the fillet height being approximately 50% of the die thickness) between the die attach fillet and the die, further having a molding compound disposed on the die, on the fillet, on a portion of the die attach material, and on a portion of the package base, in accordance with the present invention.

Figure 16:
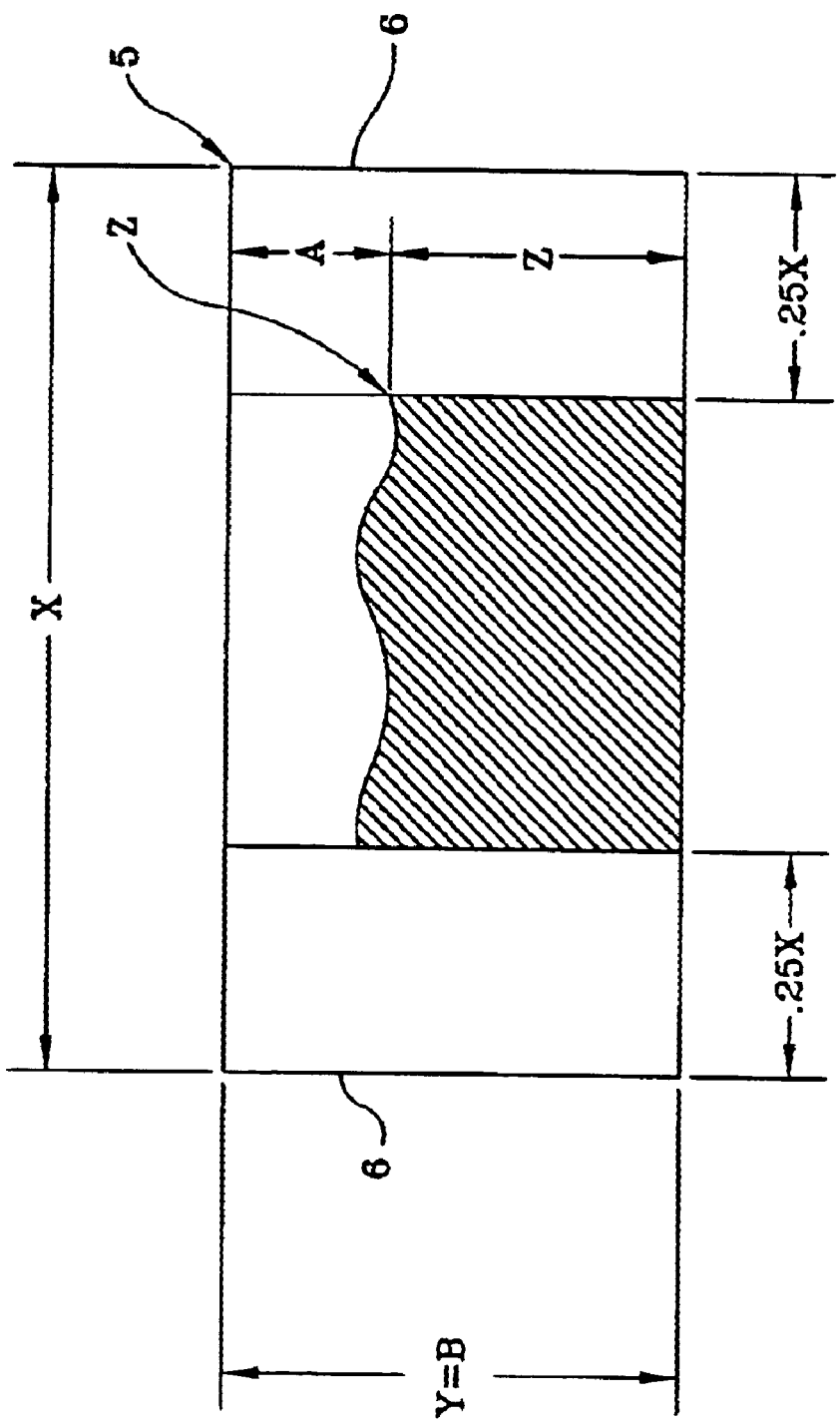

FIG. 16 is a cross-sectional view of a die having a die attach fillet, showing the preferred structural relationship (i.e., the fillet height being in a range of approximately 0% to approximately 75% of the die thickness along an approximately central 50% of the die width of any given side of the die), in accordance with the present invention.

DETAILED DESCRIPTION OF THE INVENTION

FIGS. 5–12 illustrate the problematic features of the related art semiconductor packages which are discussed, infra, in relation with the problems solved by the present invention, as illustrated in FIGS. 1–4 and 12–15.

Figure 1:
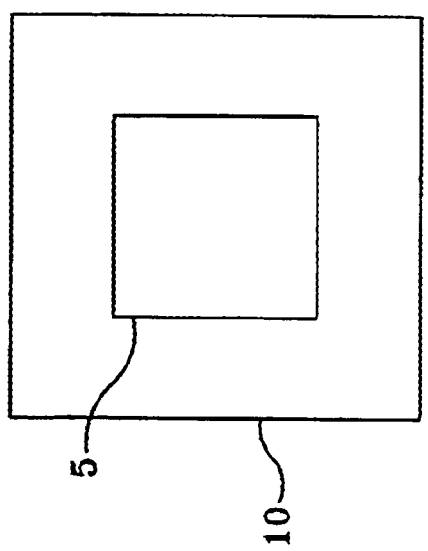
FIG. 1 is a plan-view of a die attached to a semiconductor chip package in a die attachment area with a standard die attach fillet, in accordance with a preferred embodiment of the present invention.

FIG. 1 illustrates, in plan-view, a die 5 attached to a semiconductor chip package base 10 in a die attachment area with a standard die attach fillet (not shown), in accordance with a preferred embodiment of the present invention.

Figure 2:
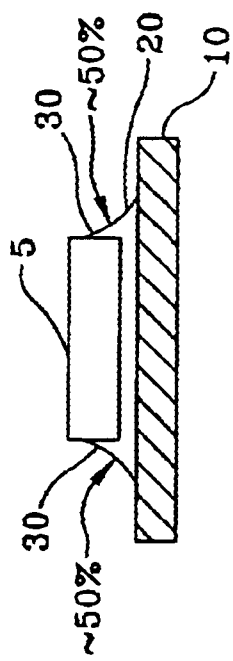
FIG. 2 is a cross-sectional view of the features as shown in FIG. 1, further showing a die attach material forming a standard die attach fillet having a height of approximately 50% of the die thickness, in accordance with a preferred embodiment of the present invention.

FIG. 2 illustrates, in cross-sectional view, the features as shown in FIG. 1, further showing a die attach material 20 forming a standard die attach fillet 30 having a height of approximately 50% of the die 5 thickness, wherein the standard die attach fillet height comprises an approximately uniform height distribution around the die 5, in accordance with a preferred embodiment of the present invention.

Figure 3:
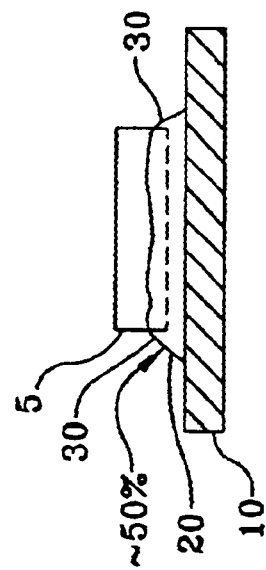
FIG. 3 is a cross-sectional side view of the features as shown in FIG. 1, further showing a die attach material forming a standard die attach fillet having a height of approximately 50% of the die thickness, in accordance with a preferred embodiment of the present invention.

FIG. 3 illustrates, in cross-sectional side view, the features as shown in FIG. 1, further showing a die attach material 20 forming a standard die attach fillet 30 having a height of approximately 50% of the die 5 thickness, wherein the standard die attach fillet height comprises an approximately uniform height distribution around the die 5, in accordance with a preferred embodiment of the present invention.

Figure 4:
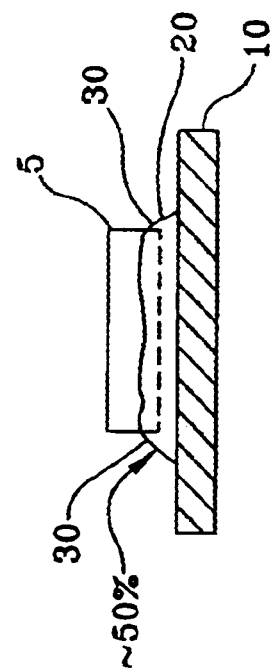
FIG. 4 is an opposing cross-sectional side view of the features as shown in FIG. 1, further showing a die attach material forming a standard die attach fillet having a height of approximately 50% of the die thickness, in accordance with a preferred embodiment of the present invention.

FIG. 4 illustrates, in opposing cross-sectional side view, the features as shown in It FIG. 1, further showing a die attach material 20 forming a standard die attach fillet 30 having a height of approximately 50% of the die 5 thickness, wherein the standard die attach fillet height comprises an approximately uniform height distribution around the die 5, in accordance with a preferred embodiment of the present invention.

Figure 5:
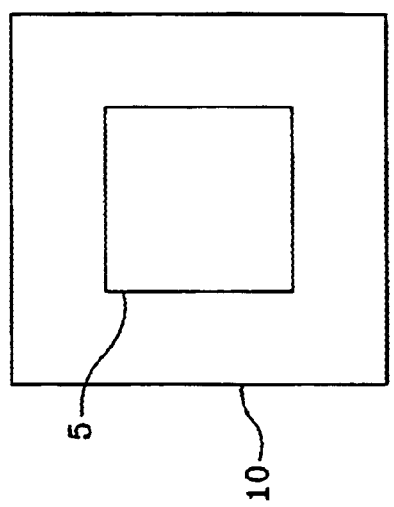
FIG. 5 is a plan-view of a die attached to a semiconductor chip package in a die attachment area with a high/even die attach fillet, in accordance with the related art.

FIG. 5 illustrates, in plan-view, a die S attached to a semiconductor chip package base 10 in a die attachment area with a high/even die attach fillet (not shown), in accordance with the related art.

Figure 6:
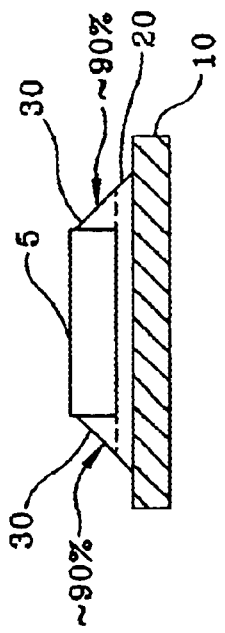
FIG. 6 is a cross-sectional view of the features as shown in FIG. 5, further showing a die attach material forming a high/even die attach fillet having a height of approximately 90% of the die thickness, in accordance with the related art.

FIG. 6 illustrates, in cross-sectional view, the features as shown in FIG. 5, further showing a die attach material 20 forming a high/even die attach fillet 30 having a height of approximately 90% of the die 5 thickness, wherein the high/even die attach fillet height comprises an approximately uniform height distribution around the die 5, in accordance with the related art.

Figure 7:
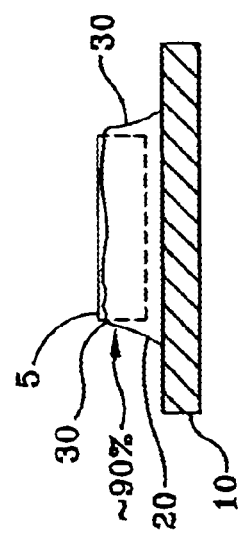
FIG. 7 is a cross-sectional side view of the features as shown in FIG. 5, further showing a die attach material forming a high/even die attach fillet having a height of approximately 90% of the die thickness, in accordance with the related art.

FIG. 7 illustrates, in cross-sectional side view, the features as shown in FIG. 5, further showing a die attach material 20 forming a high/even die attach fillet 30 having a height of approximately 90% of the die 5 thickness, wherein the high/even die attach fillet height comprises an approximately uniform height distribution around the die 5, in accordance with the related art.

Figure 8:
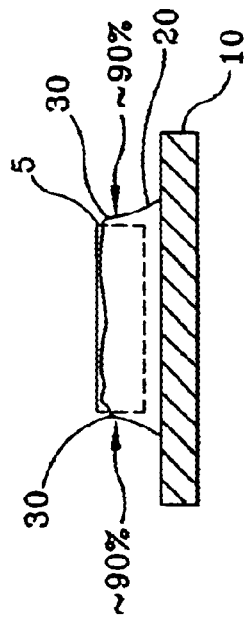
FIG. 8 is an opposing cross-sectional side view of the features as shown in FIG. 5, further showing a die attach material forming a high/even die attach fillet having a height of approximately 90% of the die thickness, in accordance with the related art.

FIG. 8 illustrates, in opposing cross-sectional side view, the features as shown in FIG. 5, further showing a die attach material 20 forming a high/even die attach fillet 30 having a height of approximately 90% of the die 5 thickness, wherein the high/even die attach fillet height comprises an approximately uniform height distribution around the die 5, in accordance with the related art.

Figure 9:
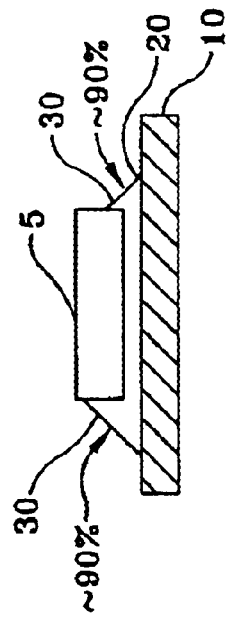
FIG. 9 is a plan-view of a die attached to a semiconductor chip package in a die attachment area with a high/low die attach fillet, in accordance with the related art.

FIG. 9 illustrates, in plan-view, a die 5 attached to a semiconductor chip package base 10 in a die attachment area with a high/low die attach fillet (not shown), in accordance with the related art.

Figure 10:
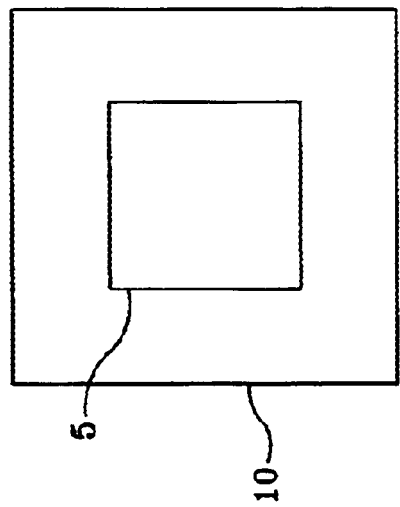
FIG. 10 is a cross-sectional view of the features as shown in FIG. 9, further showing a die attach material forming a high/low die attach fillet, a high side of the die attach fillet having a height of approximately 90% of the die thickness and a low side of the die attach fillet having a height of approximately 25% of the die thickness, in accordance with the related art.

FIG. 10 illustrates, in cross-sectional view, the features as shown in FIG. 9, further showing a die attach material 20 forming a high/low die attach fillet 30, a high side of the die attach fillet 30 having a height of approximately 90% of the die 5 thickness and a low side of the die attach fillet 30 having a height of approximately 25% of the die 5 thickness, wherein the high/low die attach fillet height comprises a non-uniform height distribution around the die 5, in accordance with the related art.

Figure 11:
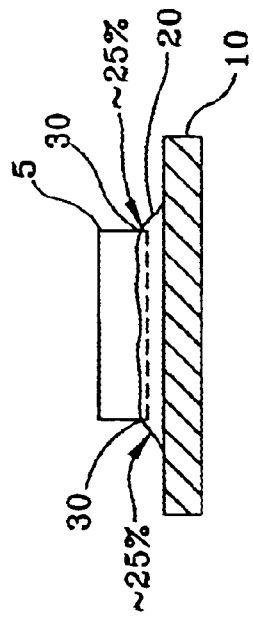
FIG. 11 is a cross-sectional side view of the features as shown in FIG. 9, further showing a die attach material forming a high/low die attach fillet, the high side of the die attach fillet having a height of approximately 90% of the die thickness, in accordance with the related art.

FIG. 11 illustrates, in cross-sectional side view, the features as shown in FIG. 9, further showing a die attach material 20 forming a high/low die attach fillet 30, a high side of the die attach fillet 30 having a height of approximately 90% of the die 5 thickness and a low side of the die attach fillet 30 having a height of approximately 25% of the die 5 thickness, wherein the high/low die attach fillet height comprises a non-uniform height distribution around the die 5, in accordance with the related art.

Figure 12:
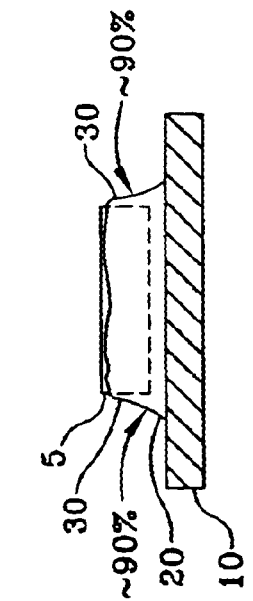
FIG. 12 is an cross-sectional opposing side view of the features as shown in FIG. 9, further showing a die attach material forming a high/low die attach fillet, the low side of the die attach fillet having a height of approximately 25% of the die thickness, in accordance with the related art.

FIG. 12 illustrates, in cross-sectional opposing side view, the features as shown in FIG. 9, further showing a die attach material 20 forming a high/low die attach fillet 30, a high side of the die attach fillet 30 having a height of approximately 90% of the die 5 thickness and a low side of the die attach fillet 30 having a height of approximately 25% of the die s thickness, wherein the high/low die attach fillet height comprises a non-uniform height distribution around the die 5, in accordance with the related art.

Figure 13:
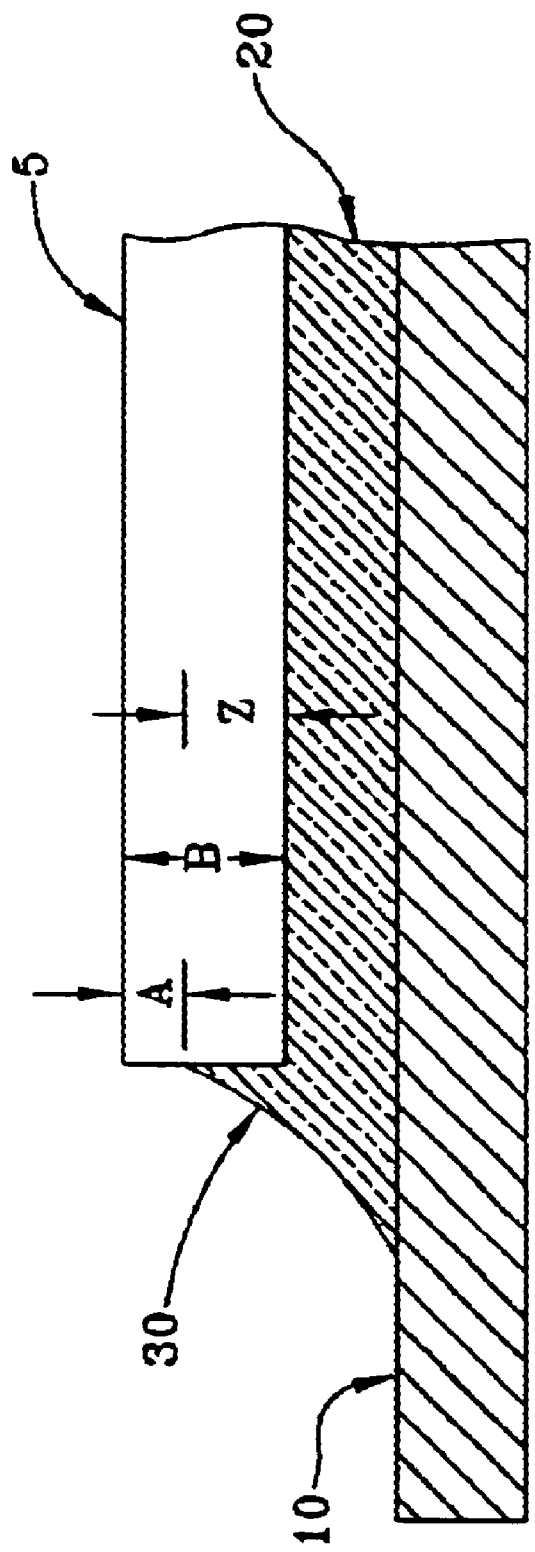
FIG. 13 is a partial cross-sectional view a die attached to a semiconductor chip package base in a die attachment area with a die attach fillet, showing the critical dimensional relationship between the die attach fillet height $Z=B-A$ and the die thickness B, wherein A=the portion of the die thickness B not covered by the fillet, in accordance with the present invention.

FIG. 13 illustrates, in partial cross-sectional view, a die 5 attached to a semiconductor chip package base 10 in a die attachment area with a die attach fillet 30, showing the critical dimensional relationship between the die attach fillet height $Z=B-A$ and the die thickness B, wherein A=the portion of the die thickness B not covered by the fillet 30, in accordance with the present invention.

Figure 14:
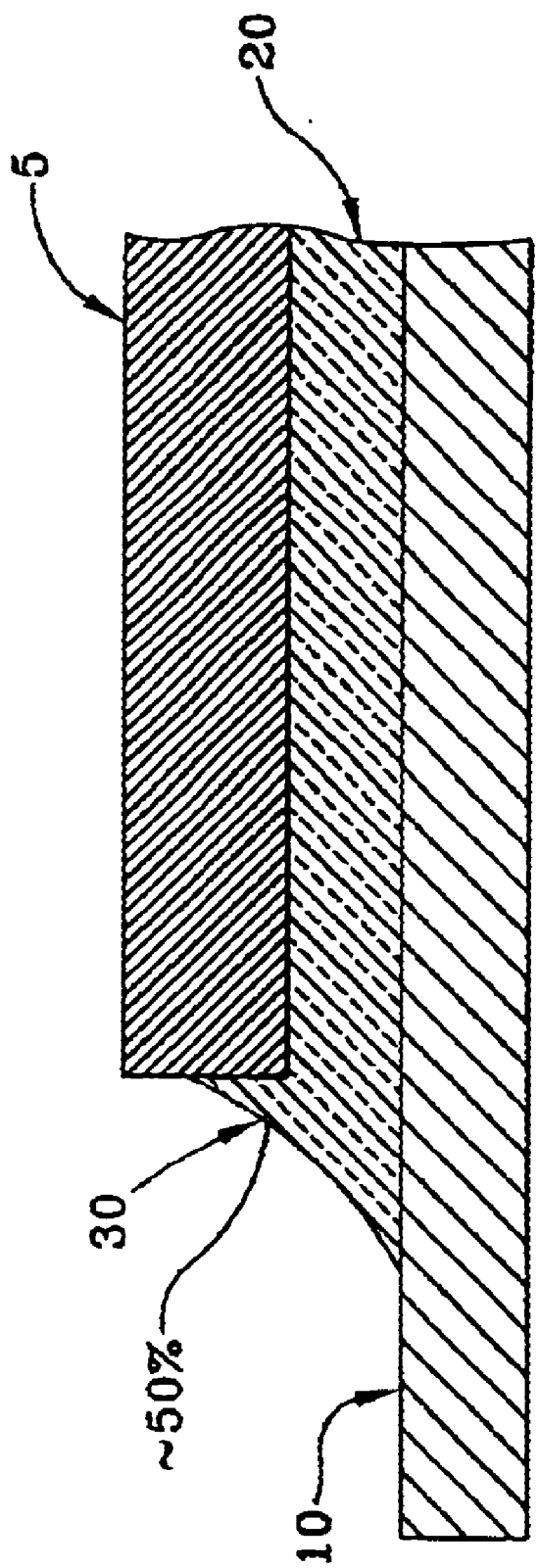
FIG. 14 is a partial cross-sectional view of a die attached to a BGA semiconductor chip package in a die attachment area with a die attach fillet, showing the critical structural relationship between the die attach fillet and the die, in accordance with the present invention.

FIG. 14 illustrates, in partial cross-sectional view, a die 5 attached to a semiconductor chip package base 10, such as a BGA package, in a die attachment area with a die attach fillet 30, showing the critical structural relationship (i.e., the fillet height being approximately 50% of the die thickness) between the die attach fillet 30 and the die 5, in accordance with the present invention.

FIG. 15 illustrates, in partial cross-sectional view, a die 5 attached to a semiconductor chip package base 10, such as a BGA package, in a die attachment area with a die attach fillet 30, showing the critical structural relationship (i.e., the fillet height being approximately 50% of the die thickness) between the die attach fillet 30 and the die 5, further having a molding compound 60 disposed on the die 5, on the fillet 30, on a portion of the die attach material 20, and on a portion of the package base 10, in accordance with the present invention.

FIG. 16 illustrates, in cross-sectional view, a die 5 having a die attach fillet 30, showing the critical structural relationship (i.e., the fillet height $Z=B-A$ being in a range of approximately 0% to approximately 75% of the die thickness $Y=B$ along an approximately central 50% of the die width X of any given side of the die 5), in accordance with the preferred embodiment present invention. In essence, $Z \cong (0\% \text{ to } 75\%)Y \cong (0\% \text{ to } 75\%)B$ is the constraint for a location approximately $\geq 25\%$ X (i.e., at least 25% inboard from each edge 6 on any given side of the die 5). Preferably, $Z \cong (>33\% \text{ to } 75\%)Y \cong (>33\% \text{ to } 75\%)B$ is the constraint for a location approximately $\geq 25\%$ X (i.e., at least 25% inboard from each edge 6 on any given side of the die 5). This constraint for the preferred embodiment is surprisingly effective in reducing overall shear stress in the packaged device. During the assembly process, controlling the fillet height in the outboard regions (i.e., less than 25% X) is very difficult. Thus, the present method constrains the fillet height in the inboard region (i.e., at least 25% inboard from each edge 6 on any given side of the die 5) where the potential damage suffered from shear stress would otherwise be at its greatest. In so doing, the present method results in a packaged device having significantly reduced shear stress.

The present invention method of reducing shear stress in a packaged semiconductor chip, generally comprises the steps of: providing a semiconductor chip package base 10 having a semiconductor chip disposed therein and having a die attachment area; providing a die 5 having a thickness Y, a width X, and at least one side; providing a die attach material 20; controlling an amount of the die attach material 20 disposed between the die 5 and the semiconductor chip package base 10, whereby at least one portion of the die attach material 20 forms at least one meniscus on the at least one side of the die 5, whereby the at least one meniscus forms at least one die attach fillet 30 upon curing of the die attach material 20, thereby controlling at least one height $Z=B-A$ of the at least one die attach fillet 30, and thereby reducing shear stress in the die 5; and completing packaging of the semiconductor chip.

The present invention reduced shear stress packaged semiconductor chip, generally comprises: a semiconductor chip package base 10 having a semiconductor chip disposed therein and having a die attachment area; a die 5 having at least one side; a controlled amount of die attach material 20 disposed between the die 5 and the semiconductor chip package base 10; at least one portion of the die attach material 20 forming at least one meniscus on the at least one side of the die 5, the at least one meniscus forming at least one die attach fillet 30 upon curing of the die attach material 20, the at least one die attach fillet 30 having at least one controlled height Z=B−A, and the die 5 having reduced shear stress.

In the present method and apparatus for reducing shear stress in a packaged semiconductor chip, the die 5 may comprise silicon and have a thickness in a range of approximately 4 mils to approximately 30 mils, preferably approximately 10 mils to approximately 14 mils, as a somewhat thicker die has surprisingly superior crack resistance. A die 5, which is sawn by step-cut, is preferable as having less pre-existing internal stresses and may preferably be approximately 367 mils$^2$ in plan area. The die attach material 20 may comprise an epoxy, and may comprise a filler selected from a group consisting essentially of a conductor and an insulator.

The die attach fillet height (i.e., "fillet percentage") is calculated by the simple relationship, fillet %=100(B−A)/B, wherein B=the die thickness, and wherein A=vertical distance of a die side which has not been coated with the die attach material. The die attach fillet 30 may also comprise a standard height Z in a range of approximately 40% to approximately 60% (nominally approximately 50%) of the die thickness Y=B. By purposefully constraining the die attach fillet height to approximately 50% of the die thickness, the present invention also reduces shear stress in the die which, in turn, reduces overall stress in the packaged semiconductor chip. The preferred embodiment (i.e., greater than approximately 33%–approximately 75% of the die thickness has been discussed, supra, with respect to FIG. 16.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A reduced shear stress packaged semiconductor chip, comprising:
    a semiconductor chip package base having a die attachment area;
    a die having at least one side and at least one edge,
        said die comprising a semiconductor material selected from a group consisting essentially of silicon (Si), germanium (Ge), and gallium arsenide (GaAs), and each said at least one side having a thickness and a width; and
    a controlled amount of die attach material disposed between said die and said semiconductor chip package base;
    at least one portion of said die attach material forming at least one meniscus on said at least one side of said die,
        said at least one meniscus forming at least one die attach fillet upon curing of said die attach material,
        said at least one die attach fillet having at least one controlled height,
        said at least one controlled height comprising a range of greater than approximately 33% to approximately 75% of said at least one die side thickness along an approximately central 50% of said die width at a location of at least 25% inboard from each said at least one edge of any given at least one die side, and
    said die having reduced shear stress.

2. A packaged semiconductor chip, as recited in claim 1, wherein said die comprises a thickness in a range of approximately 4 mils to approximately 30 mils.

3. A packaged semiconductor chip, as recited in claim 1, wherein said die attach material comprises an epoxy.

4. A packaged semiconductor chip, as recited in claim 1, further comprising a molding compound disposed on said die, on said fillet, on at least one portion of said die attach material, and on at least one portion of said package base.

5. A packaged semiconductor chip, as recited in claim 4, wherein said semiconductor chip package base comprises a ball grid array (BGA).

6. A packaged semiconductor chip, as recited in claim 1, wherein said semiconductor chip package base comprises a ball grid array (BGA).

* * * * *